United States Patent [19]
Hart et al.

[11] Patent Number: 5,455,790
[45] Date of Patent: Oct. 3, 1995

[54] HIGH DENSITY EEPROM CELL ARRAY WHICH CAN SELECTIVELY ERASE EACH BYTE OF DATA IN EACH ROW OF THE ARRAY

[75] Inventors: Michael J. Hart, Palo Alto; Albert M. Bergemont, Santa Clara, both of Calif.

[73] Assignee: National Semiconductor Corporation, Santa Clara, Calif.

[21] Appl. No.: 243,466

[22] Filed: May 16, 1994

Related U.S. Application Data

[63] Continuation-in-part of Ser. No. 891,705, Jun. 1, 1992, Pat. No. 5,379,253.
[51] Int. Cl.⁶ ............................................ H01L 29/68
[52] U.S. Cl. ................... 365/185.11; 257/315; 257/316
[58] Field of Search ............................ 365/185, 900; 257/315, 316, 509, 510, 547

[56] References Cited

U.S. PATENT DOCUMENTS

| | | | |
|---|---|---|---|
| 4,375,087 | 2/1983 | Wanlass | 365/185 |
| 4,561,004 | 12/1985 | Kuo et al. | 365/185 |
| 4,688,078 | 8/1987 | Hseih | 365/185 |
| 5,012,307 | 4/1991 | Gill et al. | 365/185 |
| 5,177,705 | 1/1993 | McElory et al. | 365/185 |
| 5,218,568 | 1/1993 | Lin et al. | 365/185 |

*Primary Examiner*—David C. Nelms
*Assistant Examiner*—Vũ A. Lêe
*Attorney, Agent, or Firm*—Limbach & Limbach

[57] ABSTRACT

Each byte of data in a high-density, electrically-erasable, programmable read-only-memory (EEPROM) cell array is selectively erased by forming a plurality of memory cells in each of a plurality of P-wells where the memory cells in each P-well are formed one byte wide by n rows in length. By forming the memory cells in each P-well to be one byte wide by n rows in length, each byte of data can be selectively erased by identifying the corresponding P-well and the row within the P-well.

17 Claims, 9 Drawing Sheets

BYTE A :
S0 to S7 ———————————————— : Vpp :
D0 to D7 ———————————————— : Vpp :
WL1 ———————————————— : Vss : Erase BYTE X-Y
WL0=WL2=WL3=WL4=WL5=WL6=WL7 : Vpp : No Erase (Equipotential)
Pwell A : Vpp :

BYTE B :
S0 to S7 ———————————————— : Vpp :
D0 to D7 ———————————————— : Vpp :
WL1 ———————————————— : Vss : No Erase
WL0=WL2=WL3=WL4=WL5=WL6=WL7 : Vpp : Program Inhibit Mode
Pwell B : Vss :

HIGH DENSITY EEPROM CELL ARRAY WHICH CAN SELECTIVELY ERASE EACH BYTE OF DATA IN EACH ROW OF THE ARRAY

RELATED APPLICATIONS

This application is a continuation-in-part of application Ser. No. 07/891,705 filed on Jun. 1, 1992, U.S. Pat. No. 5,379,253, by Albert Bergemont for HIGH DENSITY EEPROM CELL ARRAY WITH NOVEL PROGRAMMING SCHEME AND METHOD OF MANUFACTURE.

BACKGROUND OF THE INVENTION

1. Field of the Invention

The present invention relates to a high density electrically-erasable, programmable read-only-memory (EEPROM) cell array and, in particular, to a high-density EEPROM cell array which can selectively erase each byte of data in each row of the array.

2. Discussion of the Prior Art

The basic, fundamental challenge in creating an electrically-erasable programmable read only memory (EEPROM) cell is to use a controllable and reproducible electrical effect which has enough nonlinearity so that the memory cell can be written or erased at one voltage in less than 1 ms and can be read at another voltage, without any change in the programmed data for more than 10 years. Fowler-Nordheim tunneling, which was first described by Fowler and Nordheim in 1928, exhibits the required nonlinearity and has been widely used in EEPROM memories.

In silicon (Si), the energy difference between the conduction band and the valence band is 1.1 eV. In silicon dioxide ($SiO_2$), the energy difference between these bands is about 8.1 eV, with the conduction band in SiO, 3.2 eV above that in Si. Since electron energy is about 0.025 eV at thermal room temperature, the probability that an electron in Si can gain enough thermal energy to surmount the Si-to-$SiO_2$ barrier and enter the conduction band in $SiO_2$ is very small. If electrons are placed on a polysilicon floating gate surrounded by $SiO_2$, then this band diagram will by itself insure the retention of data.

Fowler-Nordheim emission, which was observed early in this century for the case of electron emission from metals into vacuums, was also observed by Lenzliger and Snow in 1969 for electron emission from silicon to silicon dioxide. In the presence of a high electric field at the Si-$SiO_2$ interface, the energy bands will be distorted and there is a small, but finite, probability that an electron in the conduction band of the Si will quantum mechanically tunnel through the energy barrier and emerge in the conduction band of the $SiO_2$.

The tunneling current increases exponentially with the applied field in accordance with the following general current density expression:

$$J=(AE^2)\exp(-B/E)$$

where

A and B ar constants, and

E is the field at the Si-$SiO_2$ interface

This current is observable at a current density of $10E-6$ $A/cm^2$ when the field at the Si-$SiO_2$ interface is about 10 MV/cm. Local fields of this magnitude, at voltages practicable for use in microelectronics, can be obtained by applying a voltage across either a thin (about 100 Å) oxide grown on bulk silicon or across thicker (about 500 Å) oxide grown on polysilicon. In the latter case, the field enhancement arises from textured polysilicon formation, i.e. positive curvature regions at the polysilicon-polysilicon oxide interface resulting in tunneling enhancement at similar voltages as in the first case.

The theoretically ideal EEPROM memory cell comprises a single transistor addressable by applying electrical signals to a specified row and a specified column of the memory array matrix. For example, to write a logic "1" or a logic "0" into a cell of this "ideal" cell, a voltage is applied to the control gate corresponding to the row (word line) of the selected cell while a voltage corresponding to either a "1" or a "0" is applied to the source or drain corresponding to the column (bit line) of the selected cell.

An important problem encountered in attempts to realize this "ideal" cell is the need for an additional access transistor in each memory cell to enable selection of a single row of memory cells while changing data in the selected cell without accidentally writing or erasing memory in other rows. Unfortunately, the presence of an additional access transistor in each memory cell increases the size of the cell and leads to impractical die size for high density Megabit memory arrays.

It is, therefore, a goal to provide an EEPROM cell which does not require an additional distinct access transistor in each memory cell to provide reliable selection of a single cell for changing data while precluding accidental simultaneous programming or erasure in non-selected cells.

The basic concept of the well-known FLOTOX EEPROM memory cell is shown in FIG. 1. In the FLOTOX cell, the tunnel oxide, which typically is less than 100A thick, is grown over an area defined photolithographically in the drain region (or an extension of the drain region, called buried N+). Charging of the floating gate to program the cell is achieved by grounding the source and the drain and applying a high voltage to the control gate. The FLOTOX cell is designed such that a large fraction of the applied voltage is coupled across the tunnel oxide resulting in the transport of electrons from the drain to floating gate. Discharge of the floating gate to erase the cell is achieved by grounding the control gate, floating the source and applying a high voltage to the drain. In this case, most of the applied voltage is coupled across the tunnel oxide, but the field is reversed, resulting in tunneling of electrons from the floating gate to the drain. The source is floated so that there is no continuous current path, an important factor when an internal charge pump is used to generate the high voltage from a $\leq 5$ V supply.

If a single transistor memory cell is placed in a typical array with drains connected to metal columns and gates connected to common polysilicon word lines, the erasing of the cell, with the word line grounded, will mean that high voltage is applied to all drains in a common column. Erasing can be inhibited in non-selected cells by taking unselected word lines to a high voltage. However, this means that unselected cells along the same word line may be programmed. To avoid such disturb conditions, as shown in FIG. 1, the FLOTOX cell utilizes a distinct access transistor to isolate the drain from the column bit line. The access transistor is off for rows that are not selected.

FIG. 2 provides a layout of the FIG. 1 FLOTOX cell, with the FIG. 1 cross section being taken perpendicular to the word line (control gate) and through the tunnel oxide window.

E. K. Shelton, "Low-power EEPROM can be reprogrammed fast", Electronics, Jul. 31, 1980, pp. 89–92, discloses a basic EEPROM concept similar to the above-described FLOTOX concept. However, as shown in FIG. 3, instead of a tunnel oxide area defined lithographically over the drain (buried N+), the Shelton cell has its tunnelling area defined in the channel under the polysilicon floating gate. The polysilicon floating gate partially spans the drain side of the channel, while the remainder of the channel (source side) is spanned by an overlying aluminum control gate. The aluminum control gate is insulated from the polysilicon floating gate by a thin silicon nitride layer.

Furthermore, the Shelton memory cell is formed in a P-well on a N-substrate. Controlling the P-well potential allows the elimination of the distinct access transistor in each memory cell. The potential of the P-well and the sources and drains of the unselected cells are chosen during programming operations to prevent minority carriers from discharging any of the floating gates to the substrate while permitting an individual selected floating gate to be programmed.

Programming of the FIG. 3 cell is achieved by grounding the P-well and connecting the drain through a load resistance to the programming voltage. The source is connected to either the programming voltage or to ground depending upon whether a "1" or a "0" is to be stored. To initiate programming, the aluminum control gate is connected to the high voltage. If the source potential is also connected to the high voltage, then the internal access transistor doesn't turn on and the surface of the P-well below the floating gate is depleted of electrons. Only a small potential difference exists between the surface of the P-well and the floating gate. Therefore, no electrons tunnel into the gate and the cell remains in a 0 state. If the source terminal is connected to ground (to program a 1), then the internal access transistor turns on, the surface potential under the floating gate drops to close to 0 V, and electrons from the inversion layer tunnel through the thin oxide into the floating gate.

The FIG. 3 cell is erased by grounding the control gate and then raising the P-well to the programming voltage. This causes electrons to tunnel from the floating gate to the P-well via the tunnel oxide. As electrons tunnel through the tunnel oxide, the floating gate acquires a net positive charge.

Although the FIG. 3 Shelton cell differs from the FIG. 1 FLOTOX cell in that it does not utilize a distinct access transistor, it does require an internal access transistor and, thus, also requires a relatively large cell size.

As stated above, this application is a continuation-in-part of co-pending application Ser. No. 07/891,705 filed Jun. 1, 1992 for HIGH DENSITY EEPROM CELL ARRAY WITH NOVEL PROGRAMMING SCHEME AND METHOD OF MANUFACTURE. The co-pending application describes an EEPROM cell array which is formed in a P-well semiconductor region which, in turn, is formed in an N-type substrate.

As is well known, conventional EEPROMs, which are typically formed with $2^n$ cells per row, e.g. 32, 64, 128 cells per row, can selectively erase each byte of data in each row of memory cells. In contrast, the EEPROM cell array described in the co-pending application cannot selectively erase each byte of data. When the bias voltages are applied to erase a memory cell, all of the memory cells in the same row are also erased.

As a result, the EEPROM array cannot be used in place of conventional EEPROMs when byte-wide erasure is required. Therefore, there is a need for a cell array as described in the co-pending application which can selectively erase each byte of data in each row of the array.

SUMMARY OF THE INVENTION

The present invention provides a high-density, electrically-erasable, programmable read-only-memory (EEPROM) cell array which allows each byte of data to be selectively erased by forming a plurality of memory cells as a byte-wide by n row array in each of a plurality of P-well substrate regions. By forming the memory cells in each P-well as a byte-wide by n-row array, one byte of data can be selectively erased by identifying one P-well region and one row within the P-well region.

In accordance with the present invention, the EEPROM array includes an N-type semiconductor substrate which has a plurality of P-type semiconductor regions formed therein as a plurality of wells. A plurality of isolation field oxide regions are formed in the substrate and the P-type semiconductor regions so that each semiconductor region is separated from an adjacent semiconductor region by an isolation field oxide region. The EEPROM array also includes a plurality of spaced-apart first field oxide regions and a plurality of pairs of spaced-apart bit lines of N-type conductivity. The first field oxide regions are formed in each of the P-type semiconductor regions so that each pair of adjacent first field oxide regions defines a P-type active device region therebetween. The pairs of bit lines are formed in each of the P-type semiconductor regions so that each pair of bit lines is formed in one active device region, so that each bit line is formed adjacent to one first field oxide region, and so that each pair of bit lines define a P-type channel region therebetween. The EEPROM array further includes a plurality of pairs of spaced-apart second field oxide regions which are formed in each of the P-type semiconductor regions so that each second field oxide region is formed adjacent to one first field oxide region, and so that each pair of second field oxide regions overlies one pair of bit lines. A plurality of strips of a gate dielectric material formed on each of the P-type semiconductor regions so that one strip of gate dielectric material is formed between each pair of second field oxide regions. Each strip of gate dielectric material has a tunnel opening formed over the P-type channel region. In the present invention, a plurality of spaced-apart memory cell structures are formed in a plurality of rows on the strips of gate dielectric material in each of the P-type semiconductor regions so that a portion of each memory cell structure in each row is formed between one pair of bit lines and within the tunnel opening, and so that n memory cell structures can be formed in each row.

A better understanding of the features and advantages of the present invention will be obtained by reference to the following detailed description of the invention and accompanying drawings which set forth an illustrative embodiment in which the principals of the invention are utilized.

DETAILED DESCRIPTION OF THE INVENTION

FIGS. 4–7 illustrate the steps for fabricating a high density EEPROM cell in accordance with the parent application.

Figure 1:
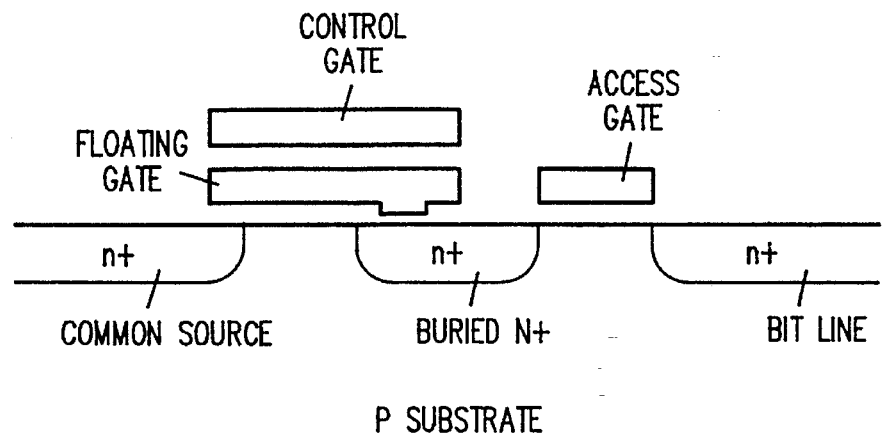
FIG. 1 is a cross-section drawing illustrating a conventional EEPROM cell structure that utilizes a distinct access transistor.
Figure 2:
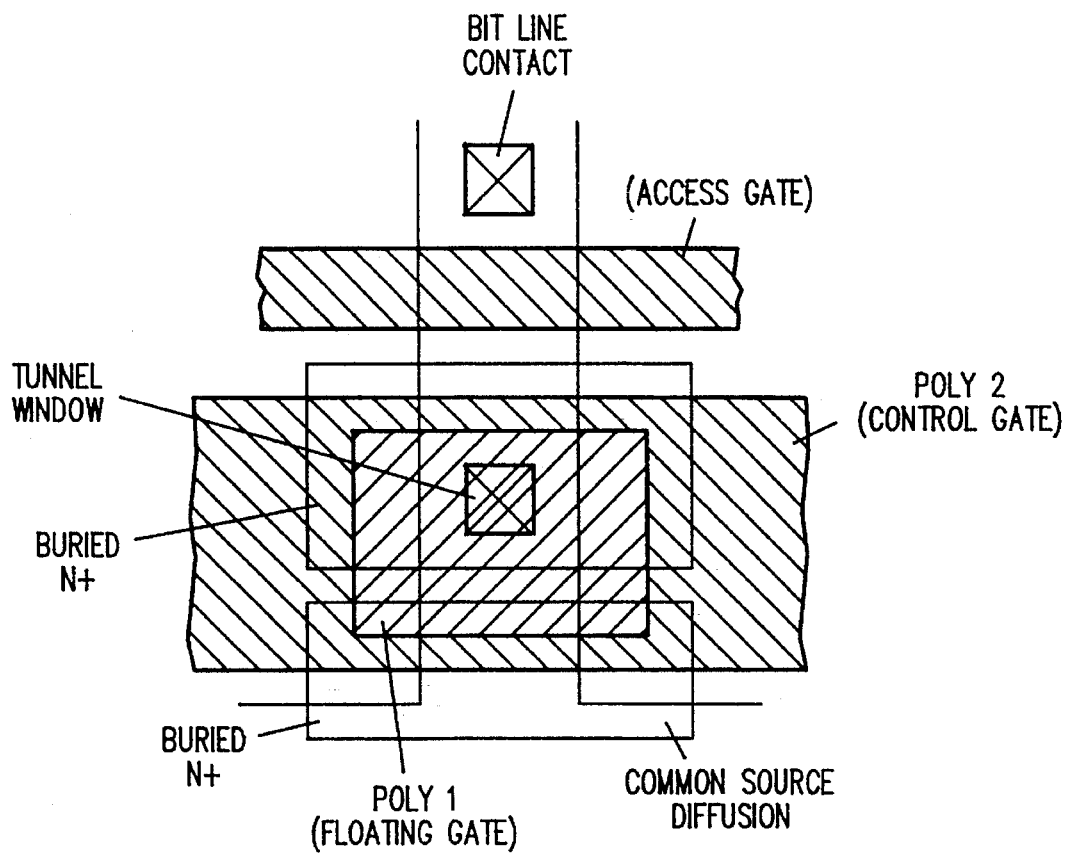
FIG. 2 is a layout illustrating the FIG. 1 cell structure.
Figure 3:
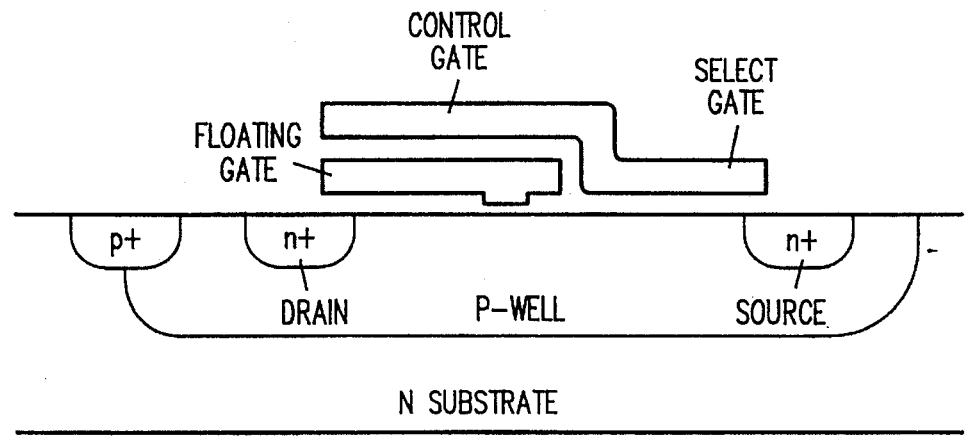
FIG. 3 is a cross-section drawing illustrating a prior art EEPROM cell that is fabricated on a P-well and utilizes an internal access transistor.
Figure 4:
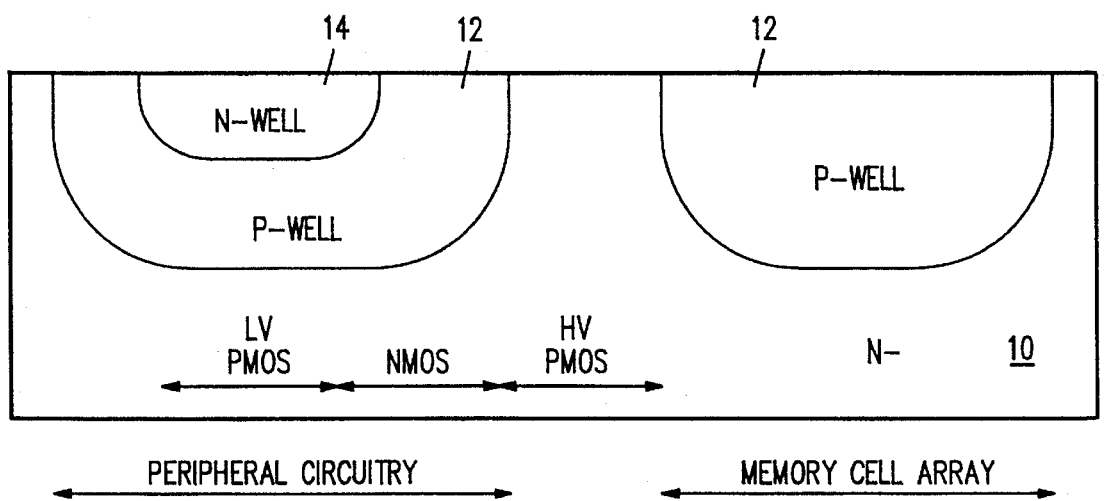
FIG. 4 is a cross-section drawing illustrating a triple-well structure utilizable in the fabrication of a high density EEPROM cell array.

Referring to FIG. 4, the fabrication process begins with a silicon substrate 10 of N-type conductivity. In a conventional front-end process step, an initial oxide layer (not shown) is grown over the substrate 10. A photoresist mask is then formed over the initial oxide layer and patterned to define selected surface areas of the N-type substrate 10. The exposed surface areas are then implanted with a P-type dopant to form P-well regions 12 in the substrate 10. The photoresist mask is then stripped from the surface of the oxide and a thermal drive-in step is performed to further define the P-well regions 12.

The initial oxide layer is then removed from the substrate 10 and a second oxide layer (not shown) is grown over the substrate 12. The substrate 12 is again masked with photoresist, which is patterned to define substrate surface areas within those P-well regions 12 which will ultimately contain the PMOS peripheral circuitry for the EEPROM memory cell array. N-type dopant is implanted into the periphery P-wells 12 to define N-well regions 14. The photoresist is then stripped and a further drive-in step for both the N-well regions 14 and the P-well regions 12 is performed. Following the drive-in step, the second oxide layer is removed, resulting in the structure shown in FIG. 4.

Thus, the initial processing steps result in the formation of a triple-well structure which defines the substrate 10 for the formation of the EEPROM memory cell array and its peripheral circuitry. The N-well regions 14 in the periphery will be utilized for the fabrication of PMOS devices. The P-well regions 12 in the periphery will be utilized for the formation of NMOS devices for the peripheral circuitry. The P-well regions 12 in the memory cell array portion of the substrate 10 will be utilized for formation of EEPROM storage cell devices.

Figure 5:
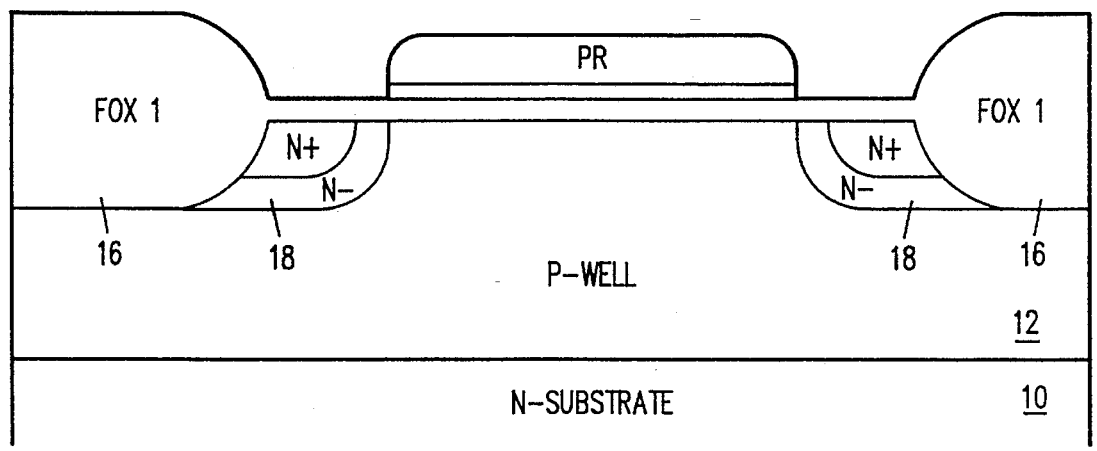
FIGS. 5–7 are cross-section drawings illustrating the fabrication of a high density EEPROM cell.

Referring now to FIG. 5, after formation of the triple-well structure described above, conventional process techniques are utilized to define regions in the substrate 10 for formation of field oxide. That is, a pad oxide is first grown on the surface of the substrate 10, followed by deposition of an overlying nitride layer. The pad oxide/nitride composite is masked with photoresist, which is then patterned to expose regions of underlying nitride which will ultimately define first field oxide (FOX1) regions. The nitride is then etched, the photoresist is stripped, a P-type field implant mask is formed, and a P-type field implant is performed through the exposed pad oxide regions. The field implant mask is then stripped and first field oxide regions (FOX1) 16 are formed, as shown in FIG. 5.

Next, as further shown in FIG. 5, portions of the P-well regions 12 in the memory cell array are masked, the nitride/oxide composite is etched, and an arsenic implant is performed to define N+ buried bit lines 18 adjacent to the FOX I field oxide regions 16. Optionally, the arsenic implant can be followed by a phosphorous implant to form graded N+/N− bit lines, thereby optimizing resistance to avalanche breakdown during the erase of the EEPROM cells.

Figure 6:
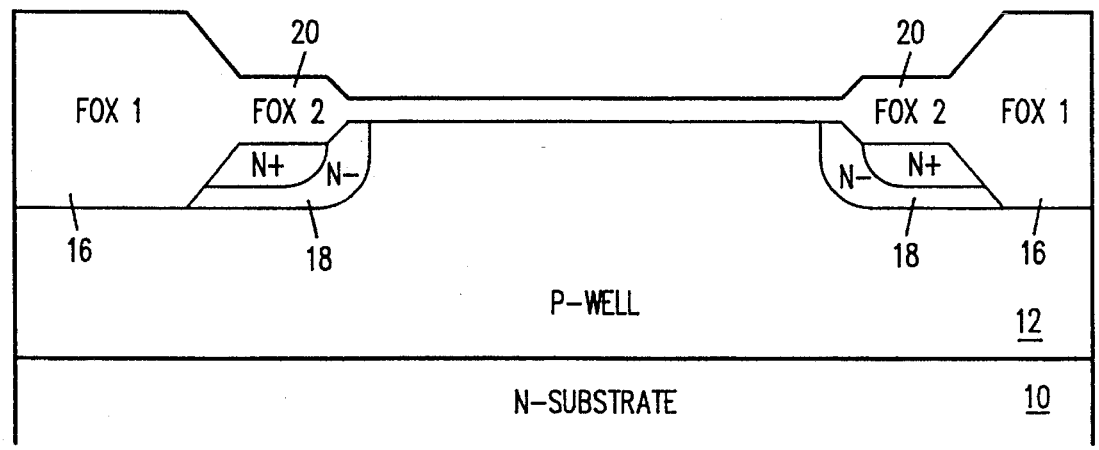

As shown in FIG. 6, the photoresist is then stripped and field oxide growth is completed by formation of second field oxide regions (FOX2) 20 over the N+/N− bit lines 18. Since the bit lines 18 are formed under the field oxide, the size of the device active region can be reduced, resulting in a reduced overall array size.

After completion of the field oxide growth, i.e. formation of FOX1 regions 16 and FOX2 regions 20, the oxide/nitride/oxide (ONO) layer is removed and a sacrificial oxide layer (not shown) is formed. A threshold voltage mask is then formed and patterned to expose the channel regions of the P-channel devices of the array. A threshold implant is then performed to characterize the threshold voltage of the storage cell transistors and the photoresist mask is stripped. Then the sacrificial oxide is removed.

Next, a gate oxide layer 22 about 300–500 Å thick is grown over the exposed portions of P-well region 12. A tunnel mask is then formed over the gate oxide 22 and patterned to define a tunnel window over the P-well 12. The tunnel window is then etched through to the surface of the underlying P-well 12. The tunnel mask is then stripped and tunnel oxide 24 about 80–100 Å thick is grown in the tunnel window. Next, a first layer 26 of polysilicon is deposited on the underlying oxide to a thickness of about 1500 Å and doped with phosphorous in a conventional manner. The polysilicon (poly1) will serve as the floating gate for the EEPROM cells of the array. A composite dielectric layer 28 of oxide/nitride/oxide (ONO) is then formed on the poly1. After growing this ONO layer 28, a photoresist mask is used to define strips on the ONO. The ONO/poly1 composite is then plasma etched to form parallel lines of ONO/poly1.

After stripping the photoresist from the poly1 mask, a thin edge oxide is grown on the sidewalls of the poly1 lines to provide insulation from subsequently-formed control gate conductive material. Next, a protect array mask is formed over the memory cell array portion of the substrate 10 and device formation in the periphery proceeds.

First, oxide is etched from the substrate active device regions in the periphery and gate oxide is grown on the active device regions. A threshold mask is then formed and a P-type implant is performed to set the threshold of the peripheral MOS devices. The threshold photoresist mask is then stripped and processing begins to form both the word lines for the memory cell array and the gates for the MOS devices in the periphery.

That is, a second layer of polysilicon (poly2) is deposited over the surface of the entire device and doped in the conventional manner. This is followed by deposition of an overlying layer of tungsten silicide. The poly2/tungsten silicide composite is then masked and etched to define the word lines 30 in the storage cell array and the gate electrodes of the peripheral MOS devices, the word lines 30 running perpendicular to and overlying the ONO/poly1 lines in the array. The poly2 mask is then UV-hardened and a self-aligned etch (SAE) mask is formed. This is followed by a stacked etch of the poly1 floating gates 26 utilizing the overlying poly2 word lines 30 as a mask for the self-aligned etch of the ONO/poly1 composite.

The remaining photoresist is then stripped from the device and a sidewall seal oxidation step is performed on the devices in the peripheral region and for the poly1/poly2 stack in the array. From this point, the process flow proceeds according to standard CMOS process techniques. The resulting cell structure is shown in FIG. 7.

Figure 7:
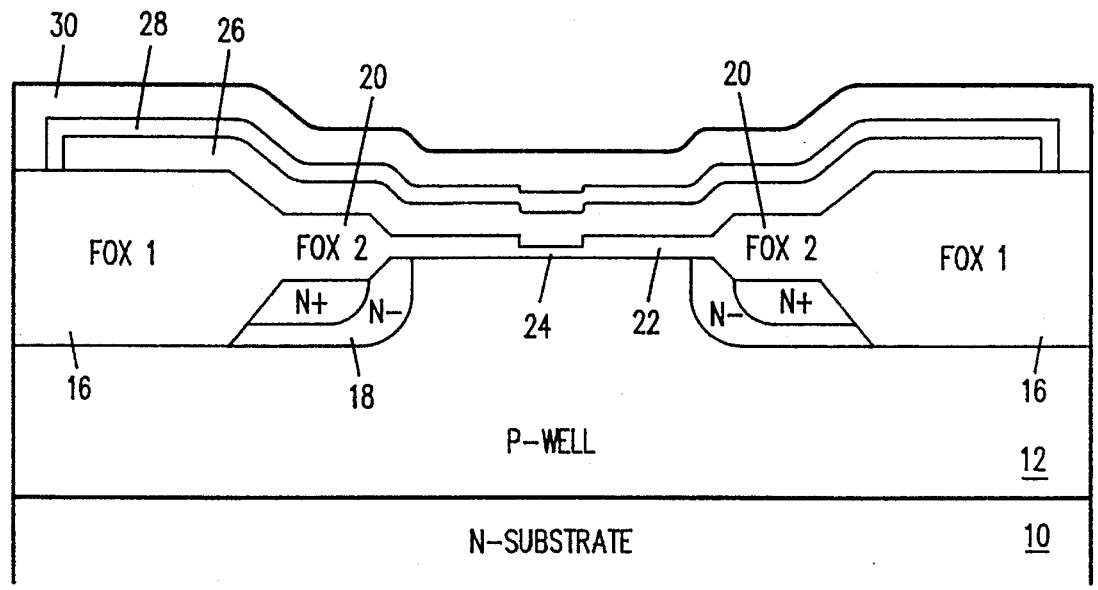
Figure 8:
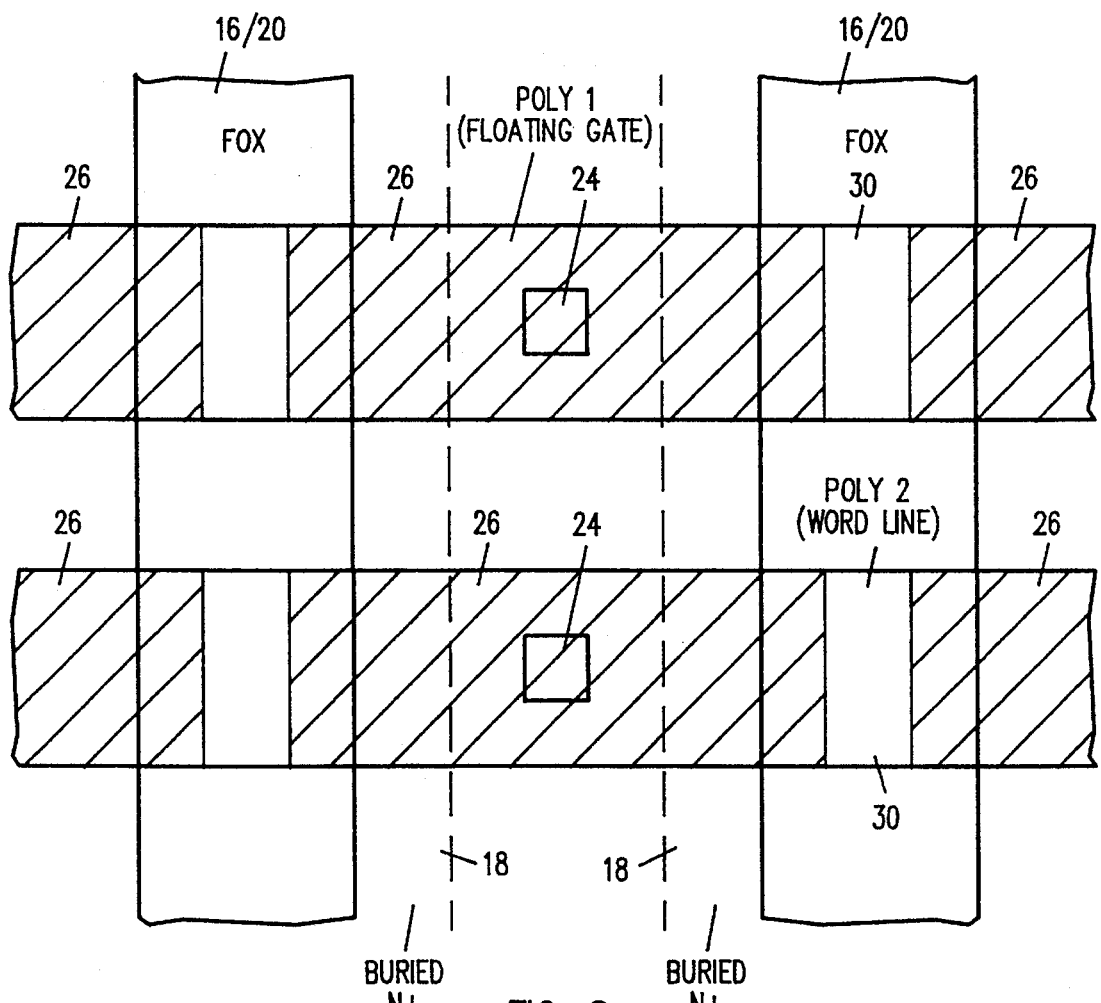
FIG. 8 is a layout illustrating the FIG. 7 cell structure.

A corresponding layout of the FIG. 7 cell is shown in FIG. 8, with the FIG. 7 cross section being taken along a word line 30 in the FIG. 8 layout.

Figure 9:
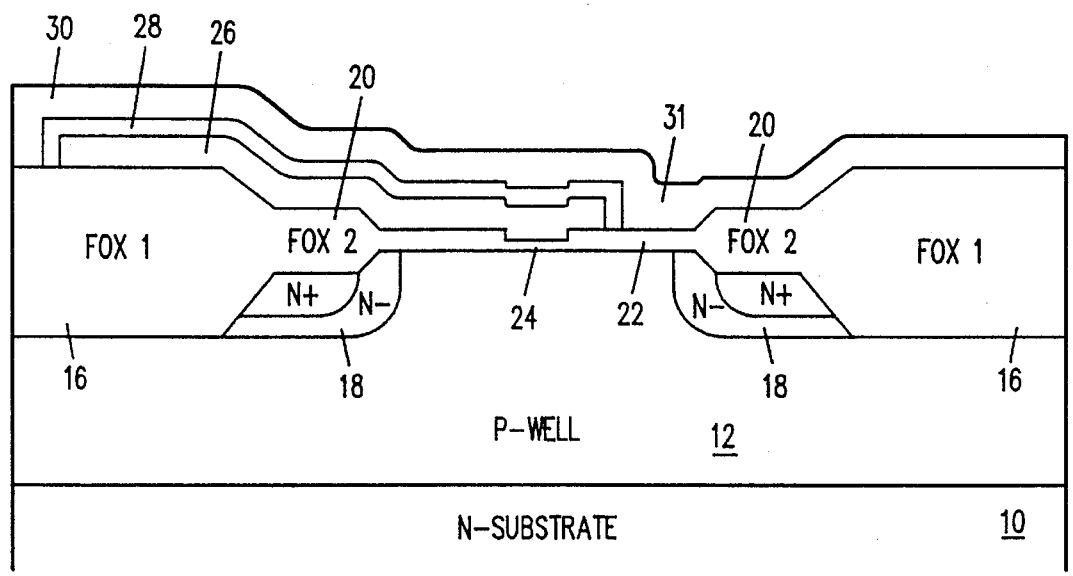
FIG. 9 is a cross-section drawing illustrating a second alternative embodiment of a high density EEPROM cell.

FIG. 9 illustrates a cross section of an alternative embodiment of a EEPROM memory cell in accordance with the parent application wherein the poly1 floating gate 26 is truncated over the P-well region 12 between N+ buried bit lines 18. Thus, the overlying poly2 word line 30 forms the gate 31 of an internal access transistor in a manner similar to the Shelton cell described above. However, because of the advantages provided by the processing techniques described above, the FIG. 9 cell is smaller than the Shelton cell and utilizes a poly2 access gate rather than an aluminum gate.

Figure 10:
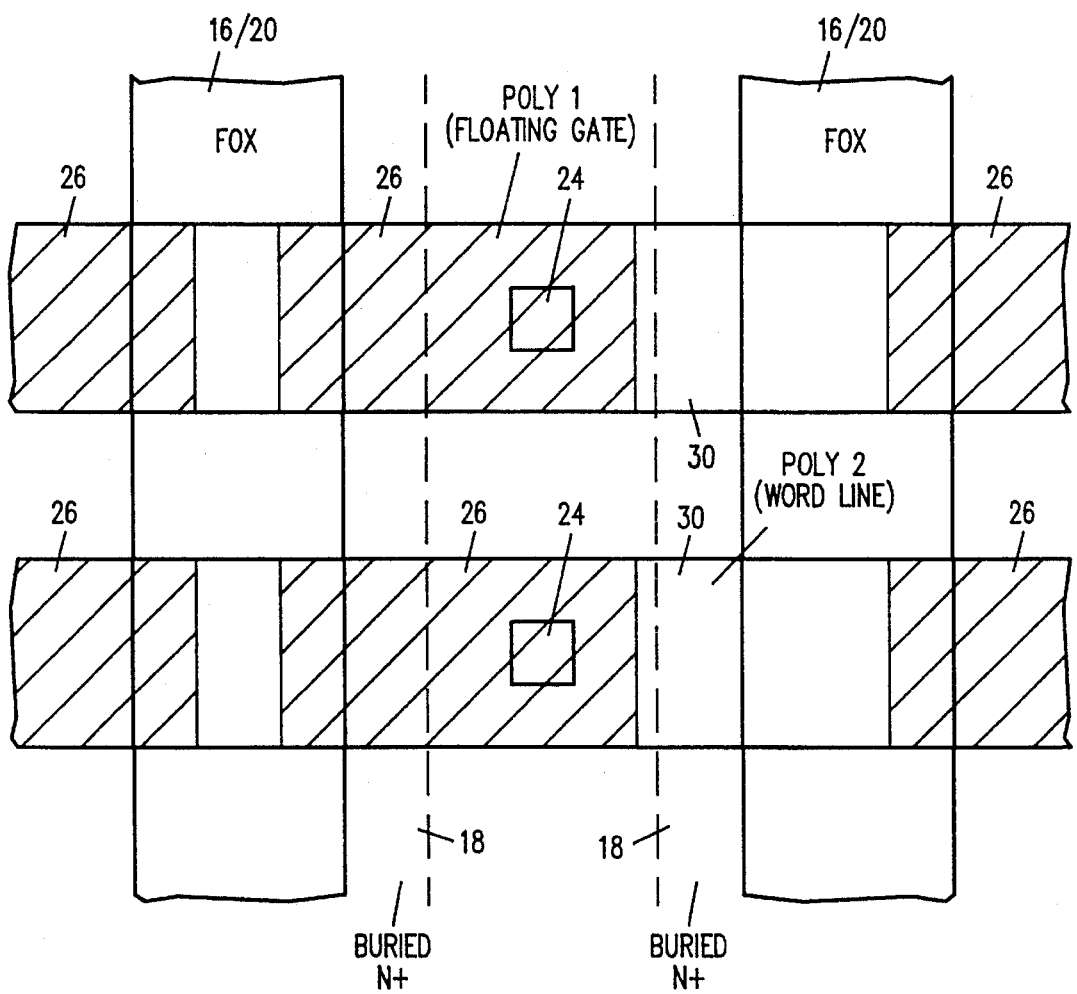
FIG. 10 is a layout illustrating the FIG. 14 cell structure.

A layout of the cell shown in FIG. 9 is provided in FIG. 10, the FIG. 9 cross-section being taken along a word line 30 in the FIG. 10 layout.

Although the cell shown in FIGS. 7 and 8 eliminates the access transistor typically utilized in EEPROM cells, it is, thus, susceptible to over-erase, resulting in read disturb problems. Therefore, the FIG. 7/8 embodiment may require a special erase algorithm to prevent over-erase. For example, the erase operation could be allowed to proceed for some specified time period, e.g. 10 μsec, after which the threshold voltage $V_T$ of each cell in the array is read. If the threshold voltage $V_T$ of any cell in the array is less a specified value, e.g. 1.2 V, then the erase procedure is terminated. If the threshold voltage of all cells remains above 1.2 V, then another timed erase iteration is performed.

As stated above, the FIG. 9/10 embodiment includes a select transistor to address the over-erase problem, but requires greater overall cell area to do so.

In both embodiments of the parent application, the resulting array relies on a novel compact cell that does not require a separate access transistor. Furthermore, as stated above, in both embodiments, the buried N+ regions do not define the storage transistor channel which, rather, is self-aligned with the field oxide, particularly the FOX2 second field oxide region 20, thereby further reducing cell size.

Figure 11:
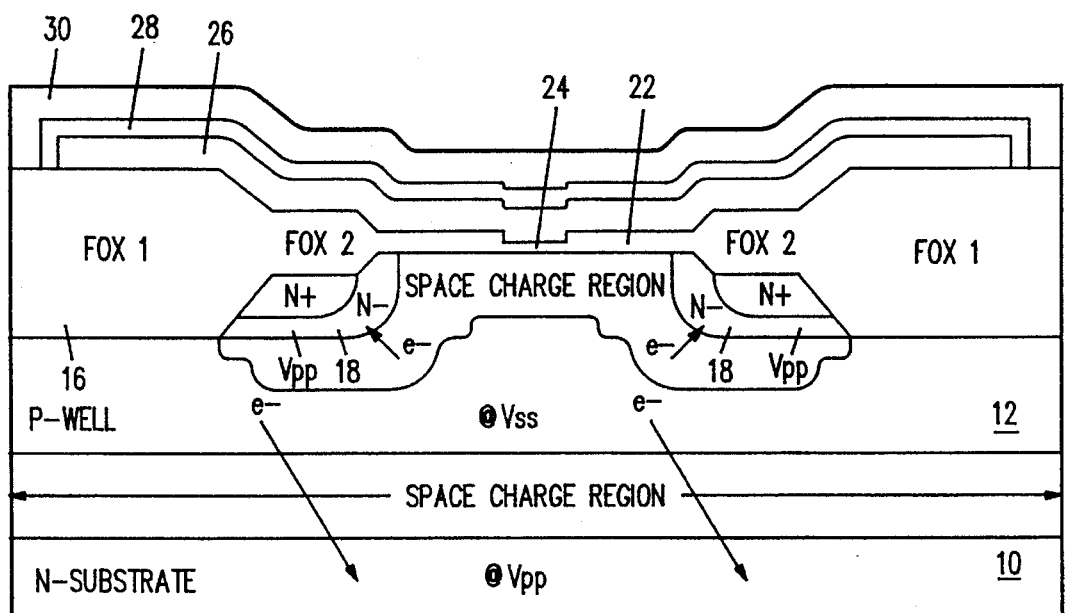
FIG. 11 is a cross-section drawing illustrating program inhibit conditions in the cells during programming.

Table 1 provides a novel programming scheme for both the FIG. 7/8 and FIG. 9/10 embodiments of the parent application. In accordance with another aspect of the parent application, and as shown in FIG. 11, the Table 1 program inhibit scheme addresses deep depletion during programming by causing any minority carriers (i.e. electrons) thermally generated in the P-well 12 or in the space charge regions to be "sucked up" by the N−/P− well and N+ bit line/P-well reversed bias junctions.

More specifically, with reference to FIG. 12, the programming conditions are as follows. To program cell A, word line WL1 is held at the programming voltage $V_{pp}$. Bit line $BL_n$ and bit line $BL_{n'}$ are held at the low supply voltage $V_{ss}$. The P- well is also held at $V_{ss}$. This creates an inversion layer of minority carriers in the channel, causing electrons to tunnel to the floating gate.

TABLE 1

|  | Source | Drain | Control Gate | p-Well | N-Sub |
|---|---|---|---|---|---|
| Write | Vss | Vss | Vpp | Vss | Vpp |
| WL Write Inhibit | Vpp | Vpp | Vpp | Vss | Vpp |
| BL Write Inhibit | Vss | Vss | Vss | Vss | Vpp |
| Erase | Vpp | Vpp | Vss | Vpp | Vpp |
| WL Erase Inhibit | Vpp | Vpp | Vpp | Vpp | Vpp |
| Read | Vss | Vread | Vcc | Vss | Vcc |

During this operation, cell C is program- inhibited by holding word line WL2 at $V_{ss}$, bit line $BL_n$ and $BL_{n'}$ at $V_{ss}$ and the P-well at $V_{ss}$. Furthermore, cell B is program inhibited by holding word line WL1 at $V_{pp}$ and raising bit line $BL_{n+1}$ and $BL_{n'+1}$ to the programming voltage, while the P-well is held at $V_{ss}$. This avoids the occurrence of any minority carriers at the P-well surface under the floating gate; the only minority carrier generation is thermal and all of these electrons are evacuated from the P-well 12 by the bit line/P-well and N-/P-well reverse bias junctions.

Figure 12:
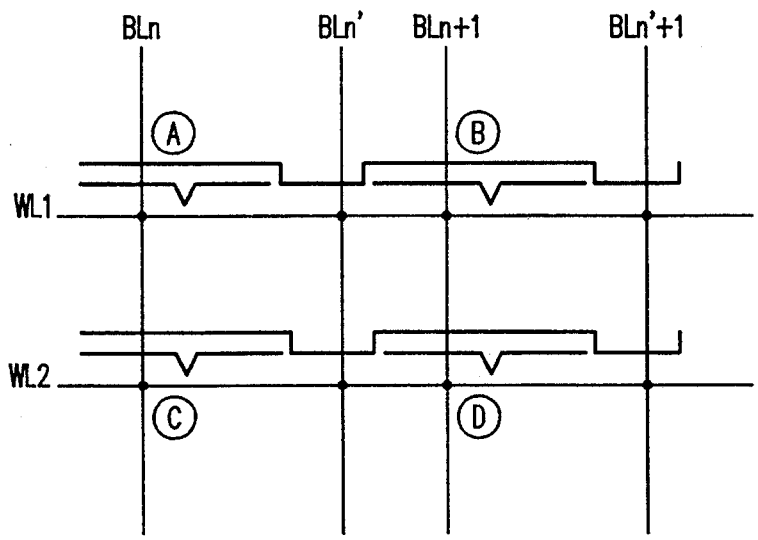
FIG. 12 is a schematic diagram illustrating a portion of a high density EEPROM cell array.

As shown in Table 1, cell A of FIG. 12 is read by first setting the source bit line, such as bit line $BL_n$, to the low supply voltage $V_{ss}$, while the drain bit line, such as bit line $BL_{n'}$, is set to the read voltage $V_{read}$. Next, word line WL1 is set to the intermediate voltage Vcc. As is well known, once the bit line and word line voltages are established, the logical state of cell A is then determined by sense amplifiers which generate a representative voltage based on the current flow through the cell.

With continuing reference to FIG. 12, in accordance with another aspect of the co-pending application, the erase conditions for the above-described cell are as follows. To erase cell A and its associated byte or word line, word line WL1 is held at $V_{ss}$ while bit lines $BL_n$ and $BL_{n'}$ and $BL_{n+1}$ and $BL_{n'+1}$, as well as the P-well, are held at the programming voltage Vpp. During this operation, cell C is erase inhibited by holding word line WL2 at the programming voltage.

One problem with the co-pending application is that, when the bias voltages are applied to the cell array to erase a memory cell, all of the memory cells in that row of memory cells are erased. Since each row of memory cells typically includes more cells than the number required to represent one byte of data, the EEPROM cell array described in the co-pending application cannot selectively erase each byte of data.

As described in greater detail below, the present invention allows each byte of data to be selectively erased by forming a plurality of memory cells in each of a plurality of P-wells where the memory cells in each P-well are formed one byte wide by n rows in length. By forming the memory cells in each P-well to be one byte wide by n rows in length, each byte of data can be selectively erased by identifying the corresponding P-well and the row within the P-well.

Figure 13:
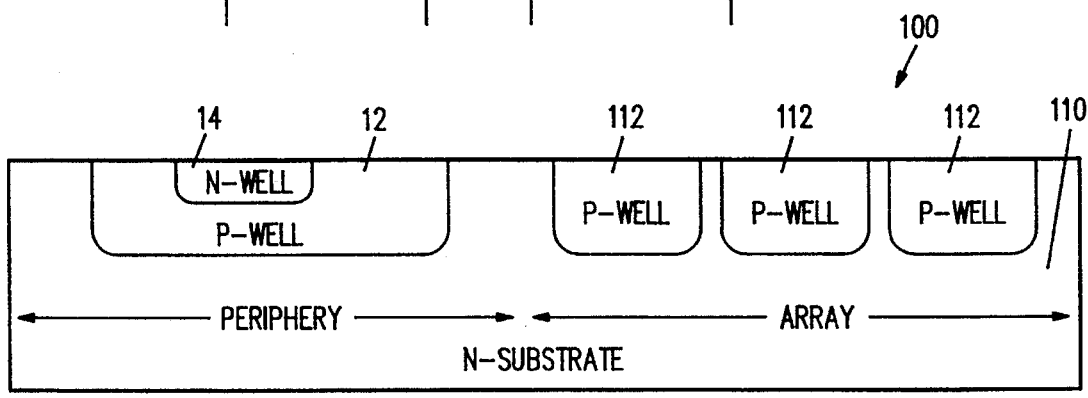
FIG. 13 is a cross-sectional diagram illustrating the multi-well structure of an EEPROM 100 in accordance with the present invention.

FIG. 13 shows a cross-sectional diagram of an EEPROM 100 in accordance with the present invention. As shown in FIG. 13, EEPROM 100 includes a multiple-well structure as described in the copending application except that, rather than forming a single memory cell array P-well 12, as shown in FIG. 4, a plurality of byte-wide by n-row P-wells 112 are formed in the memory cell array region of an N-type semiconductor substrate 110.

Figure 14:
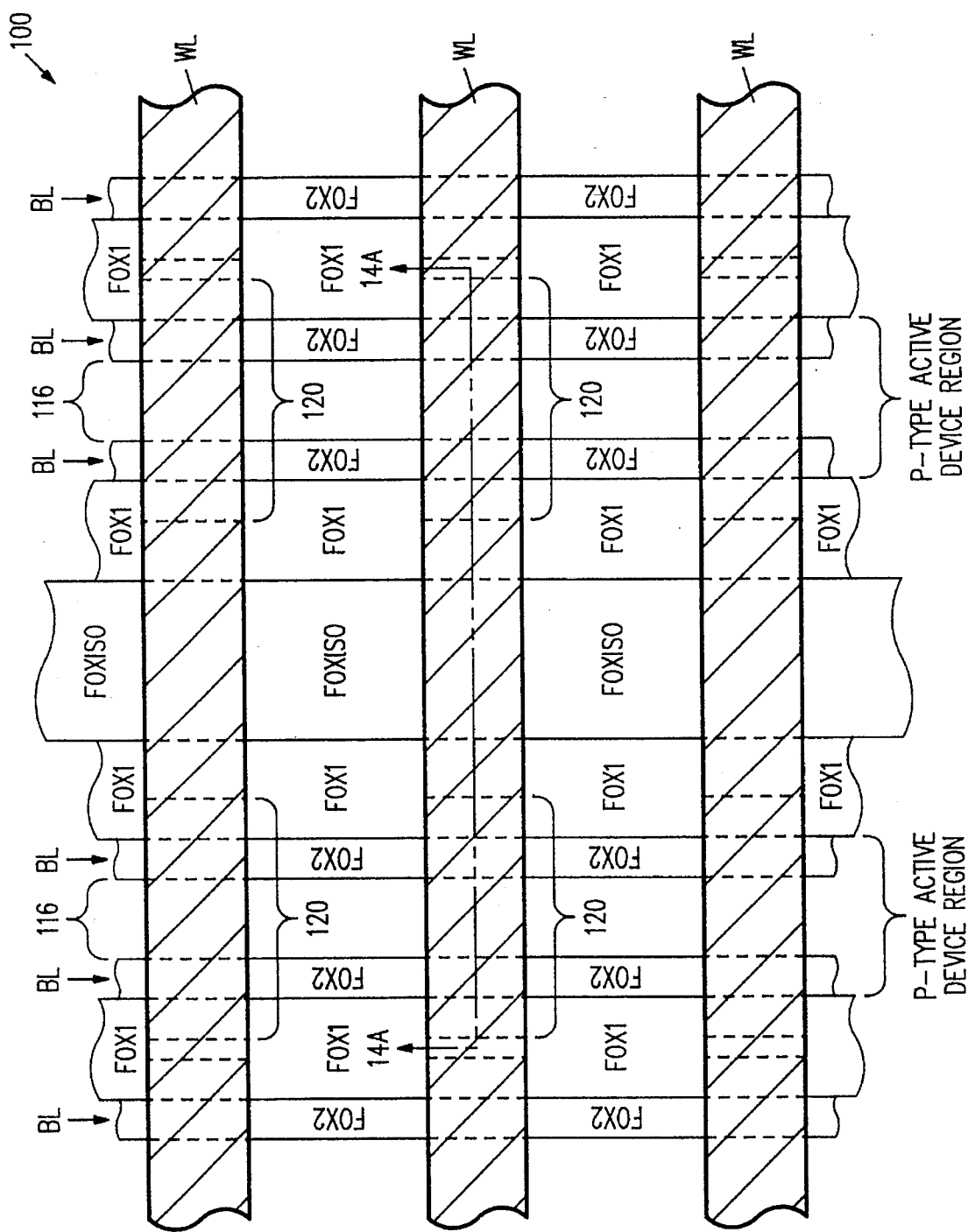
FIG. 14 is a plan view illustrating a pair of adjacent P-well regions 112 in accordance with the present invention.
Figure 15:
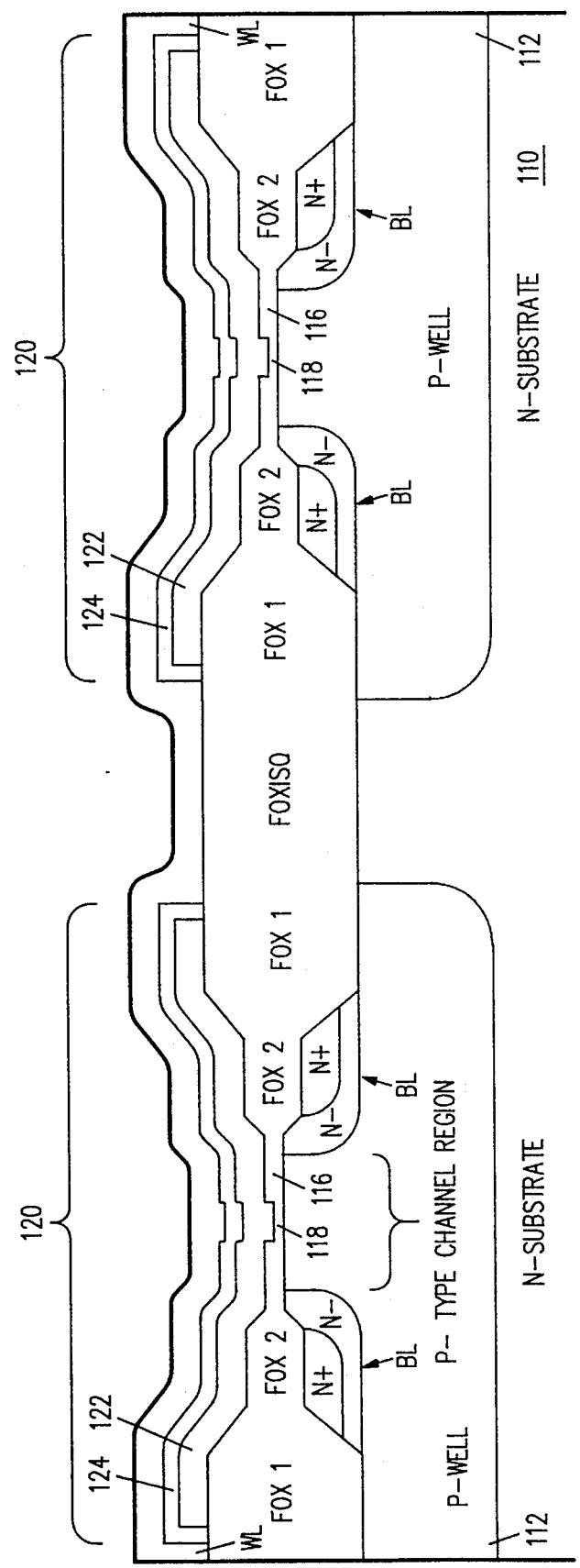
FIG. 15 is a cross-sectional diagram taken along lines 14A—14A.

FIG. 14 shows a plan view that illustrates a pair of adjacent P-well regions 112 in accordance with the present invention. FIG. 15 shows a cross-sectional diagram taken along lines 14A—14A.

As shown in FIGS. 14 and 15, EEPROM 100 further includes a plurality of isolation field oxide regions FOXISO which are formed in the substrate 110 and the P-wells 112 so that each P-well 112 is separated from an adjacent P-well 112 by an isolation field oxide region FOXISO. In addition, a plurality of spaced-apart field oxide regions FOX1 are also formed in each P-well 112 of EEPROM 100 so that each pair of adjacent field oxide regions FOX1 defines a P-type active device region therebetween.

Further, a plurality of pairs of spaced-apart bit lines BL of N-type conductivity are formed in each P-well 112 of EEPROM 100. As shown in FIGS. 14 and 15, each pair of bit lines BL are formed in one P-type active device region so that each bit line BL is formed adjacent to one field oxide region FOX1, and so that each pair of bit lines BL define a P-type channel region therebetween.

EEPROM 100 also includes a plurality of pairs of spaced-apart field oxide regions FOX2 which are formed in each P-well 112. As shown in FIGS. 14 and 15, each field oxide region FOX2 is formed adjacent to one field oxide region FOX1 so that each pair of field oxide regions FOX2 overlie one pair of bit lines BL.

In addition, a plurality of strips of gate oxide 116 are formed on the substrate in each P-well 112 so that one strip of gate oxide 116 is formed between each pair of field oxide regions FOX2. As stated above, each strip of gate oxide 116 has a tunnel opening 118 which is formed over the P-type channel region.

EEPROM 100 also includes a plurality of spaced-apart memory cell structures 120 which are formed in a plurality of rows on the strips of gate oxide 116 in each P-well region 112. As shown in FIG. 15, a portion of each memory cell structure 120 in each row of memory cell structures 120 is formed between one pair of bit lines BL and within the tunnel opening 118. As also shown in FIG. 15, each memory cell structure 120 includes a layer of polysilicon (poly1) 122 which, in the preferred embodiment, also covers a portion of the adjacent field oxide regions FOX1 and FOX2, and an overlying composite layer of oxide-nitride-oxide (ONO) 124.

Further, the memory cell structures 120 are formed in each P-well region 112 as m columns by n rows so that the number of memory cell structures formed in each row of memory cell structures 120 represents one byte of data. Alternately, any convenient number of memory cell structures 120 can also be formed in each row, e.g. two bytes of data, three bytes of data.

EEPROM 100 additionally includes a plurality of word lines WL which, in the preferred embodiment, are formed so that each word line WL contacts each memory cell structure 120 in one row of memory cell structures 120 in each P-well. As is well known, the portion of the word line WL which is formed over each memory cell structure 120 functions as the control gate of the cell.

Thus, in accordance with the present invention, by forming a plurality of memory cell structures 120 in each P-well 112 as m columns by n rows of cells, and by setting the number of memory cell structures in each row to be equal to the number of cells which are required to represent one byte of data, each byte of data can be selectively erased by identifying the corresponding P-well and the row within the P-well.

Figure 16:
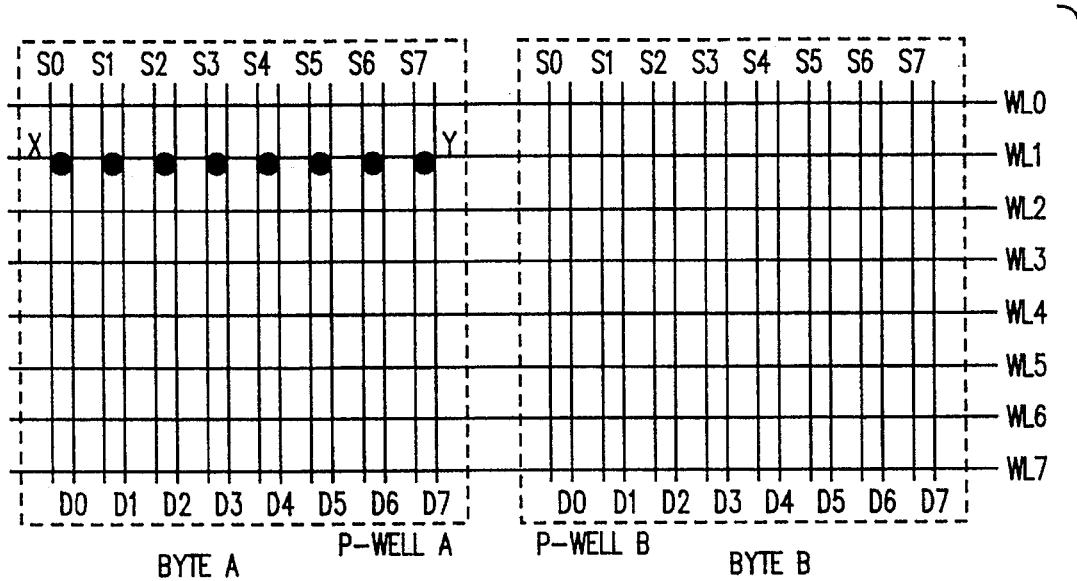
FIG. 16 is a schematic representation illustrating the memory cells in a pair of adjacent P-wells A and B, and the bias voltages required to erase one byte in P-well A.

FIG. 16 shows a schematic representation of the memory cells in a pair of adjacent P-wells A and B, and the bias voltages required to erase one byte in P-well A. As shown in FIG. 16, to erase one byte of data in P-well A, the same bias voltages listed in Table 1 also apply, except that P-well A is taken to the programming voltage Vpp while P-well B is held at ground Vss.

It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. An electrically-erasable programmable read only memory (EEPROM) comprising:

an N-type semiconductor substrate;

a plurality of P-type semiconductor wells formed in the N-type semiconductor substrate;

a plurality of isolation field oxide regions formed in the substrate such that adjacent semiconductor wells are separated by an isolation field oxide region;

a plurality of spaced-apart first oxide regions formed in each of the semiconductor wells such that each pair of adjacent first oxide regions defines a P-type active device region therebetween;

a plurality of pairs of spaced-apart bit lines of N-type conductivity formed in each of the semiconductor wells such that each pair of bit lines is formed in a different P-type active device region, each bit line is formed adjacent to one first oxide region, and each pair of bit lines define a P-type channel region therebetween;

a plurality of pairs of spaced-apart second oxide regions formed in each of the semiconductor wells such that each second oxide region is formed adjacent to one first oxide region, and such that each pair of second oxide regions overlies one pair of bit lines; and a plurality of memory cell structures formed in a plurality of rows on each of the semiconductor wells such that each memory cell structure in each row is formed over a different P-type channel region, and such that m memory cell structures are formed in each row, where m is an integer, wherein each memory cell structure includes:

a layer of gate dielectric material having a tunnel opening, the layer of gate dielectric material adjoining the pair of second oxide regions, a layer of tunnel oxide formed in a portion of the tunnel opening, a layer of first conductive material formed over the layer of gate dielectric material and extending into the tunnel opening over the layer of tunnel oxide to form a floating gate, a layer of intermediate dielectric material formed over the layer of conductive material, and a layer of second conductive material formed over the layer of intermediate dielectric material to form a control gate.

2. The EEPROM of claim 1 wherein said m memory cell structures are equal to a number of memory cells required to represent one byte of data.

3. The EEPROM of claim 1 and further comprising a plurality of word lines formed such that each word line connects the layer of second conductive material of each memory cell structure in one row of memory cell structures in each semiconductor well.

4. The EEPROM of claim 1 wherein
the layer of intermediate dielectric material is also formed on a portion of the layer of gate dielectric material.

5. The EEPROM of claim 1 wherein the gate dielectric material comprises silicon dioxide.

6. The EEPROM of claim 1 wherein the layer of first conductive material comprises a doped polysilicon.

7. The EEPROM of claim 1 wherein the intermediate dielectric material comprises oxide/nitride/oxide composite.

8. The EEPROM of claim 1 wherein the layer of second conductive material comprises a doped polysilicon.

9. The EEPROM of claim 4 wherein the layer of second conductive material is also formed on a portion of the layer of gate dielectric material.

10. The EEPROM of claim 1 wherein the layer of first conductive material is also formed on a portion of the adjacent pair of first oxide regions, and the adjacent pair of second oxide regions.

11. The EEPROM of claim 10 wherein the layer of intermediate dielectric material and the layer of second conductive material are also formed on a portion of the pair of adjacent first oxide regions.

12. The EEPROM of claim 1 wherein the layer of first conductive material is also formed on a portion of one adjacent first oxide region, one adjacent second field region, and a portion of the layer of gate dielectric material.

13. The EEPROM of claim 12 wherein the layer of intermediate dielectric material is also formed on a portion of one adjacent first oxide region, and a portion of the layer of gate dielectric material.

14. The EEPROM of claim 13 wherein the layer of second conductive material is also formed on a portion of one adjacent first oxide region, and a portion of the layer of gate dielectric material.

15. A method for erasing memory cells in a selected row of cells of an electrically-erasable programmable read-only-memory (EEPROM), the selected row of cells including cells to be erased and cells to be maintained, the EEPROM including:
an n-type semiconductor substrate;
a plurality of p-type semiconductor wells formed in the n-type semiconductor substrate, the plurality of p-type wells including a p-type well that corresponds with the cells to be erased, and a p-type well that corresponds with the cells to be maintained;
a plurality of isolation field oxide regions formed in the substrate such that adjacent semiconductor wells are separated by an isolation field oxide region;
a plurality of spaced-apart first oxide regions formed in each of the semiconductor wells such that each pair of adjacent first oxide regions defines a p-type active device region therebetween;
a plurality of pairs of spaced-apart bit lines of n-type conductivity formed in each of the semiconductor wells such that each pair of bit lines is formed in a different p-type active device region, each bit line being formed adjacent to one first oxide region, each pair of bit lines defining a p-type channel region therebetween;
a plurality of pairs of spaced-apart second oxide regions formed in each of the semiconductor wells such that each second oxide region is formed adjacent to one first oxide region, and such that each pair of second oxide regions overlies one pair of bit lines;
a plurality of memory cells formed in a plurality of rows on each of the semiconductor wells such that each memory cell in each row is formed over a different p-type channel region, and such that m memory cells are formed in each row, where m is an integer, the plurality of rows of memory cells including the selected row and an unselected row; and
a plurality of word lines formed such that each word line connects each memory cell in one row of memory cells in each semiconductor well, the plurality of word lines including a word line that corresponds with the selected row, and a word line that corresponds with the unselected row, the method comprising the steps of:
placing a first voltage on the word line that corresponds with the selected row;
placing a second voltage on the word line that corresponds with the unselected row, the second voltage being greater than the first voltage;
placing the second voltage on the plurality of pairs of bit lines;
placing the second voltage on the p-well that corresponds with the memory cells to be erased; and
placing the first voltage on the p-well to be maintained.

16. The method of claim 15 wherein the first voltage includes ground.

17. The method of claim 15 wherein the second voltage includes a programming voltage.

* * * * *